(12) United States Patent
Wu et al.

(10) Patent No.: US 9,439,330 B1
(45) Date of Patent: Sep. 6, 2016

(54) 3D IC COMPUTER SYSTEM

(71) Applicants: Banqiu Wu, San Jose, CA (US); Ming Xu, San Jose, CA (US)

(72) Inventors: Banqiu Wu, San Jose, CA (US); Ming Xu, San Jose, CA (US)

( * ) Notice: Subject to any disclaimer, the term of this patent is extended or adjusted under 35 U.S.C. 154(b) by 0 days.

(21) Appl. No.: 14/672,198

(22) Filed: Mar. 29, 2015

(51) Int. Cl.
*H05K 7/20* (2006.01)
*G06F 1/20* (2006.01)

(52) U.S. Cl.
CPC ...... *H05K 7/20772* (2013.01); *H05K 7/20781* (2013.01)

(58) Field of Classification Search
CPC .... H05K 7/20; H05K 7/1497; H05K 7/2079; G06F 1/20; G06F 1/203; G06F 1/206; H01L 23/34; H01L 23/473; F28F 3/08; F28F 7/00; F28F 3/02; F28D 15/00
USPC .............. 361/679.46–679.53, 688, 689, 698, 361/699, 702–715, 717–724; 165/45, 97, 165/104.19, 104.33, 244, 247, 80.2, 80.4, 165/80.5; 257/713, 714, 715, 686, 774, 257/777; 62/259.2, 260, 264, 235.1
See application file for complete search history.

(56) References Cited

U.S. PATENT DOCUMENTS

| | | | | |
|---|---|---|---|---|
| 6,014,313 A * | 1/2000 | Hesselbom | ......... | H01L 25/0652 174/16.3 |
| 6,504,719 B2 * | 1/2003 | Konstad | ..................... | G06F 1/20 165/104.32 |
| 7,030,485 B2 * | 4/2006 | Houle | ................. | H01L 23/3736 257/706 |
| 7,432,592 B2 * | 10/2008 | Shi | ....................... | H01L 23/473 257/714 |
| 7,551,440 B2 * | 6/2009 | Belady | ..................... | G06F 1/20 165/104.33 |
| 7,808,783 B2 * | 10/2010 | Goth | ....................... | F25B 49/02 165/80.3 |
| 7,834,440 B2 * | 11/2010 | Ito | ............................ | G11C 5/02 257/685 |
| 7,882,624 B2 * | 2/2011 | Hu | ........................ | H01L 23/473 165/104.33 |
| 7,990,711 B1 * | 8/2011 | Andry | ................... | H01L 23/147 165/80.4 |
| 8,110,415 B2 * | 2/2012 | Knickerbocker | ... | H01L 25/0652 257/712 |
| 8,159,065 B2 * | 4/2012 | Suh | .................... | H01L 21/76898 257/621 |
| 8,199,504 B2 * | 6/2012 | Kashirajima | ........... | F25B 25/00 165/104.33 |
| 8,253,234 B2 * | 8/2012 | Barowski | ............ | H01L 25/0657 257/685 |
| 8,363,402 B2 * | 1/2013 | Brunschwiler | ....... | H01L 23/473 165/80.4 |

(Continued)

OTHER PUBLICATIONS

Article Fluidic Interconnects in Integrated Liquid Cooling Systems for 3-D Stacked TSV Modules. 2008.*

*Primary Examiner* — Michail V Datskovskiy

(57) ABSTRACT

A computer system includes central processing units designed by using reduced instruction set computing (RISC) strategy, dynamic random access memory (DRAM) packages manufactured by using three-dimensional integrated circuit (3D IC) stacked using through-silicon via (TSV) stacking processes, and liquid cooling approach. The system has advantages of low power consumption, fast DRAM access rate, high performance, high cooling efficiency, small form factor, and low costs. Cooling liquid could be water, oil, and ionic liquid. The heat generated in 3D IC chips is carried out by liquid coolant and dissipated to heat exchanger where cooling water dissipates heat to large water body such as river, reservoir, or ocean. The computer disclosed in this invention is suitable to be a server for application in datacenter.

14 Claims, 3 Drawing Sheets

(56) References Cited

U.S. PATENT DOCUMENTS

| | | | | |
|---|---|---|---|---|
| 8,448,876 B2* | 5/2013 | Yang | | F24J 3/083 165/244 |
| 8,659,898 B2* | 2/2014 | Brunschwiler | | H01L 23/473 165/80.4 |
| 8,853,872 B2* | 10/2014 | Clidaras | | F03B 13/20 290/43 |
| 9,263,365 B2* | 2/2016 | Takeda | | H01L 25/0657 |
| 2005/0061541 A1* | 3/2005 | Belady | | G06F 1/20 174/252 |
| 2007/0085198 A1* | 4/2007 | Shi | | H01L 23/473 257/714 |
| 2007/0297136 A1* | 12/2007 | Konshak | | H05K 7/20772 361/699 |
| 2008/0205003 A1* | 8/2008 | Belady | | H05K 7/2079 361/700 |
| 2010/0146996 A1* | 6/2010 | Campbell | | H05K 7/2079 62/119 |
| 2012/0136596 A1* | 5/2012 | Yamaoka | | H01L 23/5286 702/64 |
| 2014/0102672 A1* | 4/2014 | Campbell | | H05K 7/20836 165/104.33 |
| 2014/0209272 A1* | 7/2014 | Stocker | | H05K 7/1497 165/59 |
| 2014/0254099 A1* | 9/2014 | Takeda | | H01L 25/0657 361/701 |
| 2014/0332930 A1* | 11/2014 | Kamiya | | H01L 23/481 257/621 |
| 2015/0223367 A1* | 8/2015 | Harrington | | F28D 1/0246 165/281 |

\* cited by examiner

3D IC COMPUTER SYSTEM

FIELD

The embodiment of present invention is generally related to a computer system using three-dimensional (3D) integrated circuit (IC) stacking technology with low energy consumption, high performance, high memory access rate, effective liquid cooling, and cost-effectiveness. More specifically, the present invention relates server computer system in datacenter applications.

BACKGROUND

Since it was invented in 1958, IC has been scaled down for the performance improvement enhanced by progress in lithography. However, after the turn of the century, scaling resulted in short-channel effect, significant interconnect delay, and memory wall, which requires other approach to improve the IC performance more effectively.

3D IC offers a reasonable route to further improve IC performance. It improves IC performance by increasing device density, reducing the interconnect delay and energy consumption, and breaking memory wall with the application of 3D stacked IC using through silicon via (TSV). 3D IC also makes one chip package have more functional diversification than those enhanced only by shrinking the size of the features. The main advantages of 3D IC are the smaller form factor, low energy consumption, high speed, and functional diversification. It is predicted that 3D IC will be an enabler for improvement of datacenter performance and efficiency with positive consequences for global energy consumption and environment.

One of the biggest challenges in 3D IC stacking technology using TSV is thermal management owing to the high heat flux up to about 200 watts per square centimeter.

In addition to performance improvement, low energy consumption for either mobile devices or servers in large datacenter is expected, which resulted in large applications of reduced instruction set computing (RISC) strategy in design of central processing unit (CPU). One example is the popular uses of ARM-based CPUs.

Datacenters for internet and mobile devices are the most critical components in our information age. They serve industries, civil communications, military and defense applications, and transportations. Datacenters consist of multiple computers usually called servers and switches. Both of them use many ICs. When a computer works, ICs will change status, or change the on-and-off status, which consumes electricity and generates significant heat. Even when computer system is at idle condition, it still consumes electricity due to the current leakage and circuit requirement.

Multiple servers are accommodated in a server rack at datacenter. Each computer consumes significant electricity. It is common for a server (computer) to consume over a hundred watts. In a server rack, i.e. a module of servers, there are multiple computers. Similarly, there are many server racks in a datacenter. Therefore, a datacenter consumes large amount of electricity and a large datacenter consumes the same amount of electricity as a small or medium size town. Among the contributions to the electricity consumption, most electricity is consumed by servers and their cooling systems. It is quite often that cooling system uses the same amount of electricity as the server computers. It is estimated that the datecenters consume about two percent of total electricity generated worldwide.

Power usage effectiveness (PUE) is usually used to measure the efficiency of a datacenter. It is defined as a ratio of total energy used by facility to that used by information technology (IT) equipment. An ideal PUE is 1.0, but average PUE worldwide now is about 2.0 although some datacenter claims their PUE is significantly below 2.0. The average PUE value of 2.0 indicates the necessity to improve the datacenter cooling effectiveness. One approach to improve the cooling efficiency is to use water cooling to replace current air cooling. In the past, water cooling was used for large scale computers, but did not obtain large scale application for personal computers or servers in datacenter because of its limitation by the shape of heat-generating components and thus the complexity.

As the dimensions of integrated circuit components decrease, more components are compacted in a given area of a semiconductor integrated circuit (for example of 3D IC). Accordingly, more transistors are held on a given area and thus more heat is generated in the same area. In order to keep the IC temperature in allowed range for proper performance, heat generated has to be transferred out of integrated circuit effectively and economically. With the internet getting popular, more and more servers are installed and in service to support the internet function. The trend of applications of more mobile devices and cloud computing technology will drive more electricity consumption at datacenters in the future.

Current servers are located in an air-conditioner-regulated environment, usually in a specially designed building. The heat generated by microprocessors, memory chips, and power supply chips is released locally, which is like a large heater in a room cooled by air conditioner. Due to the low efficiency of air conditioner, the cooling system uses lots of electricity, occupies large footprints, and causes high costs.

Accordingly, it is very significant to provide an effective method to reduce cooling power and improve cooling efficiency for computer system, especially for the system with large number of computers such as datacenter. Cooling technology now becomes an enabler to improve datacenter efficiency.

Improving cooling system in datacenter not only saves energy consumption, but also benefits ecological and environmental systems. A few percent reduction of electricity consumption in datacenter cooling system will significantly decrease the emission of carbon dioxide amount, which equivalents to shut down multiple coal power plants with environmental benefit in addition to the cost reduction.

The heat generated in electronic devices in a datacenter has to be transferred outside the accommodating construction and dissipated to environment, which consumes tremendous electricity. In order to prevent the overheat of ICs, the surface of the ICs should be kept not very high, which means the temperature difference between high temperature source (IC surface) and low temperature environment will be significant low, resulting in the challenge in engineering realization of cost-effective cooling and high costs in cooling system.

Traditionally, heat-generating components in computers are cooled by cold air supplied by air-conditioners. The air in server's building exchanges and dissipates heat on chiller's cold surface. By applying work, air conditioners transfer heat from a cold surface to a hot surface, and thus heat is dissipated to air outside the building by heat exchanging. This cooling method is accompanied with uses of lots of compressors and fans, and thus consumes significant electricity because of the low efficiency and high costs for air conditioning system.

In order to lower the cost of using air conditioner, cold air is used to directly cool the heat generating components in winter at north areas. However, the air humanity has to be controlled well and the application is also limited by weather and season.

Similarly, lots of power is used by fans in the server rack to dissipate heat from component surface to air by blowing air through the server rack, which also consumes significant energy, makes noise, and has low efficiency.

In order to overcome low efficient challenge in air cooling problems, water is used for cooling the heat-generating components. Current heat-generating components are mainly CPU, dynamic random-access memory (DRAM), and power chips. Microprocessor has a flat shape and it is relatively easy to use liquid cooling on a flat surface. However, it is difficult to use liquid cooling on DRAM dual in-line memory module (DIMM) due to the irregular shape although some attempts were tried.

In order to overcome the intrinsic problem mentioned above, liquid cooling was used by circulating liquid coolant on the surface of ICs to improve the efficiency. However, this method has to use chillers to cool the liquid, resulting in a low cooling efficiency.

In order to use natural water body for datacenter cooling, air cooling of server rack was combined with heat dissipation to large natural water bodies such as ocean, river, and lake. This approach may be the lowest datacenter operating cost and has the best potential for future application. However, there are lots of challenges for the realization of this method.

In modern mobile devices, CPU designed using RISC strategy becomes popular. It will also be used for servers in datacenter in the future.

However, datacenters consists of CPU, memory, and cooling approaches designed and manufactured by different manufacturers and teams, which results in the lack of systematic consideration for improvements of performance and efficiency.

In this invention, a novel computer system is disclosed which optimizes and designs the infrastructure with the best performance and efficiency, especially for datacenter application. The computer system uses CPU designed using RISC or power architecture strategy to save energy, three-dimensional memory to save energy and increase memory access speed for system performance improvement, and liquid cooling to reduce the cooling cost in a multiple computer system such as datacenter.

SUMMARY

A computer system using RISC-designed or power-architecture CPU, 3D memory package, and liquid cooling method are provided herein. In some embodiments, the novel computer system includes: (a) individual CPU and a stacked 3D DRAM package, or a 3D IC package which stacked CPU and DRAMs using through-silicon via interconnection; (b) liquid cooling directly on heat-generating components such as 3D CPU-memory package, power chips, and other parts, and thus dissipating heat to large water body such river, reservoir, lake, or ocean, i.e. "free" cooling.

In one embodiment, deionized (DI) water or refrigerant is used as the coolant thermally contacting the heat-generating components. In another embodiment, oil or ionic liquid is used as liquid coolant. Each coolant has its own advantage. DI-water is easy available and user-friendly; refrigerant has the minimum flow rate due to its high heat capacity; oil and ionic liquid have wide liquid temperature range, and ionic liquid can also be pumped by using electromagnetic pump.

The most important thing for a reliable cooling performance is to keep the flow rate controllable in the cooling conduit on the heat-generating components. This is enabled by controlling the pressure in the supply conduit by using an in-line pump, large ratio of cross-sectional area of supply conduit to the sum of cooling conduit cross-sectional areas on the heat-generating components. The large cross-sectional area of supply conduit determines the constant pressure of liquid coolant and then the controllable flow rates in cooling conduit on each heat-generating component, and then reliable cooling performance on every heat-generating component.

In one embodiment, liquid-liquid heat exchanger is used to dissipate heat finally to large water body. The water from large water body as a second liquid coolant needs to be pretreatment before used for cooling such as filtration to remove particles. After the pretreatment, the second coolant from the large water body will be pumped to a water tower where water surface level is maintained constant so that the water pressure on the outlet is kept constant, resulting in a constant delivery water pressure. After the second liquid coolant is used in heat exchanger, the only change is the little rise in temperature such as a few degrees. This discharge water is environmentally benign so that it can be returned to the large water body. For cooling performance controlling, valves are used on the conduit of the second liquid coolant so that the flow rate can be effectively controlled. For automatic control of the cooling performance, temperature sensors are disposed on the conduit of the second liquid coolant to feedback data for controlling the opening of the valves.

In winter season of north area, temperature is so low that water in the large water body may freeze. In order to avoid possible damage on conduits caused by freezing, the conduits of the second liquid coolant should have good protection such as underground arrangement. Such ideas are also applicable to other related parts like pumps.

Sucking of water by pump from the large water body is impacted by the water level elevation, especially when the large water body is a river. Special caution should be paid for adjustment of the relative conduit location and prevention of freeze in winter.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally provide a computer system which has high performance, low energy consumption, and effective cooling. Particularly, embodiments of the present invention provide a computer system for datacenter. In one embodiment, the computer system uses a cooling liquid thermally contacting the heat-generating IC components. The heat is carried out of the electronic devices by cooling liquid and dissipated to a large water body such as river, reservoir, or ocean.

Figure 1:
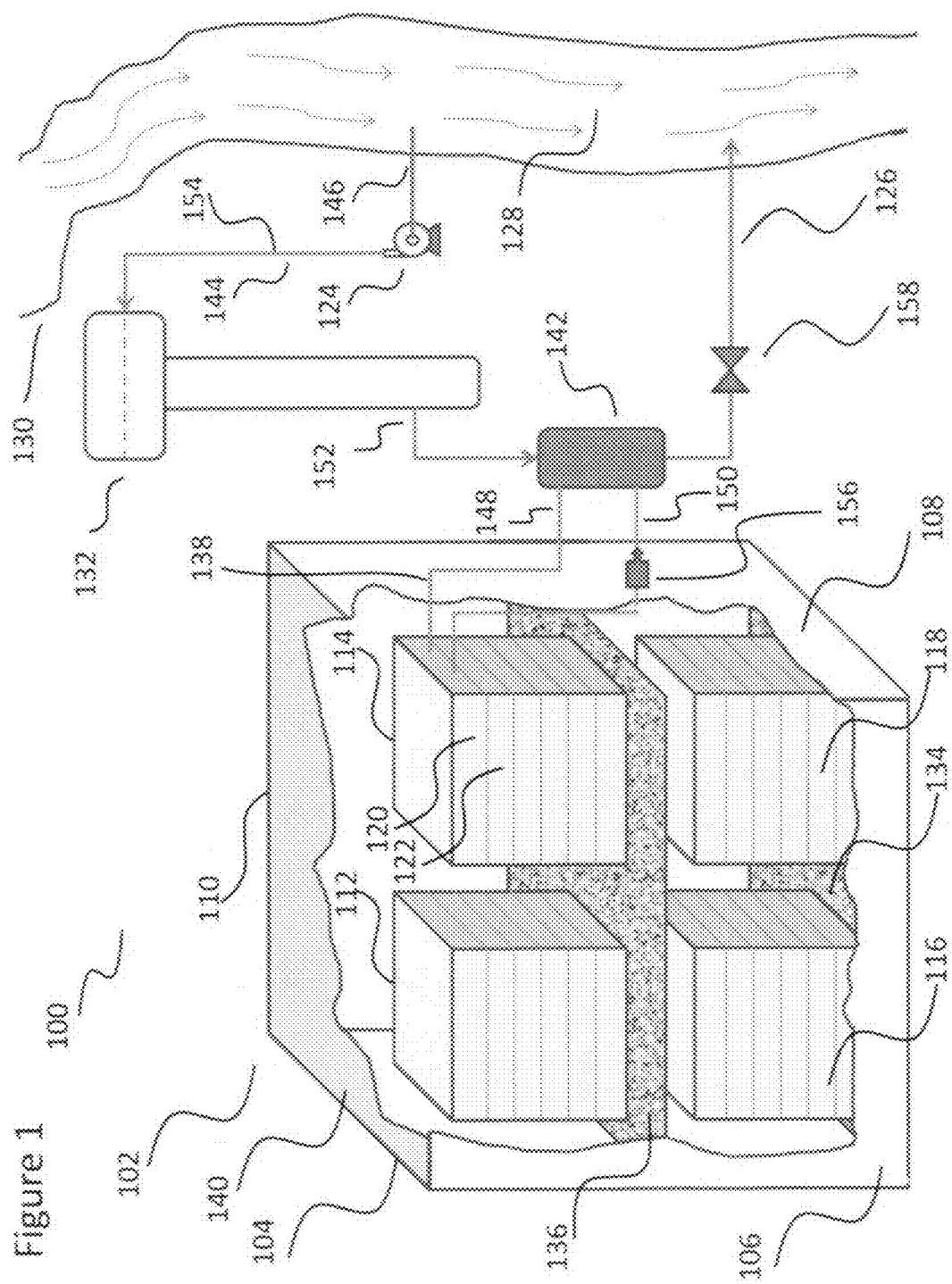
FIG. 1 depict one computer system having CPU designed using RISC strategy, 3D stacked memory package, and liquid cooling system in accordance with one embodiment of the invention.

FIG. 1 schematically illustrates a computer system 100 in accordance with one embodiment of the present invention. The computer system 100 generally comprises a building 102 configured to accommodate computers. The computer system 100 further comprises a river 130 in connection with the building 102 via a cooling water tower 132, liquid-liquid heat exchanger 142, cooling water conduit 152, drain conduit 126, pump outlet conduit 144, and pump inlet conduit 146.

The building 102 generally comprises a left sidewall 104, a front sidewall 106, a right sidewall 108, back sidewall 110, and roof 140. In one embodiment, the building 102 comprises first floor 134 and second floor 136.

The computer system 100 comprises server rack 116 and server rack 118 on first floor 134. The computer system 100 also includes server rack 112 and server rack 114 on second floor 136. A server rack usually accommodates multiple servers. In one embodiment, server rack 114 accommodates server 120 and server 122.

The computer system 100 is configured to position a cooling liquid supply conduit 148 to flow cooling liquid 138 into server 120 and carry heat out of server 120 by flowing cooling liquid 138 out of server 120 in return conduit 150. The cooling liquid supply conduit 148 and return conduit 150 are connected to a liquid-liquid heat exchanger 142. The chip contact details will be further described below with references in FIG. 2. The heat exchanger 142 dissipates heat in the cooling liquid 138 to cooling water 154. In one embodiment, one end of the liquid-liquid heat exchanger 142 is configured to be connected with cooling water tower 132 for taking cooling water 154 and the other end is connected to river for draining cooling water 154.

During cooling process, the supply conduit 148 has a higher pressure compared with return conduit 150 to ensure the flow rate for cooling performance. The cooling liquid 138 in the supply conduit 148 has a lower temperature than the cooling liquid 138 in return conduit 150. The cooling liquid 138 in return conduit 150 transfers heat out of server 120 to cooling water 154 in liquid-liquid heat exchanger 142. During the cooling liquid 138 flowing through heat exchanger 142, temperature of cooling liquid 138 keeps falling, and attains such a low temperature when flowing out of the heat exchanger 142 that the temperature meets the requirement for flowing into heat-generating components in server 120.

The heat exchanger 142 can be configured for cooling of one server, or one server rack, or multiple server racks. When heat exchanger 142 is used for cooling of multiple servers, the constant pressures in supply conduit 148 and return conduit 150 should be kept well. The cooling liquid 138 should be stable and bubbles are not allowed in order to ensure the quality of cooling and heat exchanging.

The liquid-liquid heat exchanger 142 may have high heat exchange efficiency due to the high density of liquid. The temperature difference between supply conduit 148 and return conduit 150 is low to avoid high temperature variation in heat-generating components in computer system. Typical temperature difference between these two conduits is 10-30° C. The circulation of cooling liquid 138 is driven by a pump 156 in order to have acceptable heat exchanging rate on the surface of heat-exchanging components.

Cooling water 154 is sucked from the river 130. For datacenter located in north cold area, the pump inlet conduit 146 should be well protected from freezing because it may damage the pipe system. In one embodiment, the pump inlet conduit 146 is laid underground to avoid freezing in winter. Similarly, pump 124, tower 132, conduits 144, 152, and 126 should be protected well during winter for datacenter located in north area.

According to one embodiment of the invention, the elevation of cooling water 154 in cooling tower 132 should be automatically controlled the same all the time. This can be controlled by a continuous operation mode of cooling water pump 124, or non-continuous operation mode, depending on the design. After datacenter facility is in operation, the cooling water flow rate is mainly determined by water level of the cooling water 154 in cooling water tower 132. In one embodiment, a regulating valve 158 is used to adjust the flow rate of cooling water 154 in the liquid-liquid heat exchanger 142 by varying the opening.

In one embodiment, a grate and filter is used at one end of cooling water inlet conduit 146 to keep the contaminants out of the cooling system. In addition, the elevation of one end of cooling water conduit 146 for sucking water in the river 130 should be adjusted according to the level of river, especially in the north area where river water level changes with season significantly.

For convenience of operation, the building 102 should be located close to the river 130 to reduce the length of the conduits. To ensure the performance of computer system 100, the river current 128 should be high enough for cooling of a datacenter. Generally, the river stream 128 should have a discharge of 40 m³/s or higher for cooling of a large datacenter.

In one embodiment, the cooling liquid 138 is deionized water. In another embodiment, the cooling liquid 138 is oil or ionic liquid.

Figure 2:
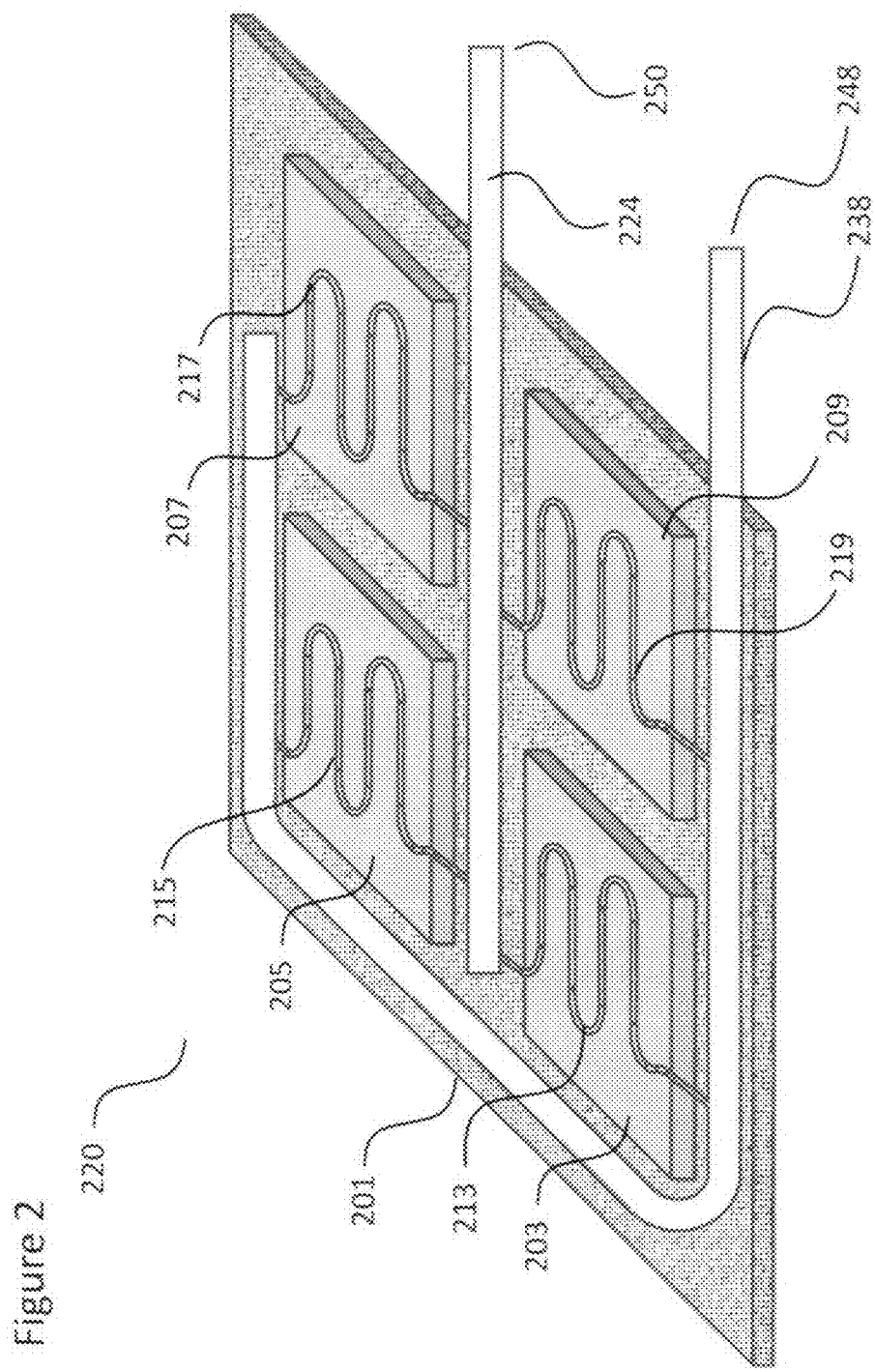
FIG. 2 depicts a schematic view of a CPU designed using RISC strategy, 3D-stacked DRAM package, and liquid cooling in accordance with one embodiment of the present invention.

FIG. 2 schematically illustrates an enlarged view of the server 220 disposed in the server rack 114 of FIG. 1. The server 220 includes the board 201 configured to accommodate components. The board 201 supplies mechanical holding to components and electrical interconnection among the devices. The board 201 can be a printed circuit board (PCB) or silicon interposer. In one embodiment, the board 201 holds a RISC-CPU 203, a 3D-stacked memory package 205, a power-supply chip 207, and a memory storage 209. The server 220 also accommodates supply conduit 248, return conduit 250, CPU cooling conduit 213, 3D-stacked memory cooling conduit 215, power cooling conduit 217, and store cooling conduit 219, wherein cooling liquid 238 flows for heat exchanging.

The cross-sectional areas of liquid conduits may vary for cooling effectiveness. In one embodiment, the cross-sectional areas of supply conduit 248 and return conduit 250 are significantly larger than those of CPU cooling conduit 213, 3D-stacked memory cooling conduit 215, power cooling conduit 217, and store cooling conduit 219.

The cooling liquid 238 is circulated in a closed loop shown in FIG. 1. Liquid conduits shown in FIG. 2 are part of the total closed loop. In order to have effective heat exchanges between devices and the cooling liquid 238, moderate flow rate in heat-generating components should be kept. Generally, the turbulent flow in CPU conduit 213, memory conduit 215, power conduit 217, and storage conduit 219 should be maintained. The pump 156 shown in FIG. 1 drives the flow rate and ensures the effectiveness of heat dissipation.

Heat dissipation makes temperature in the return conduit 250 is higher than that in the supply conduit 248. The higher temperature difference between these two conduits means more energy carried out at a same flow rate. However, low temperature difference should be kept in order to have a more uniform temperature on the heat-generating components. The non-uniformity of temperature may introduce extra stress, resulting in reliability issues. Typical temperature difference between the supply conduit 248 and return conduit 250 is about 20° C.

CPUs consume most power in a computer system. Effective contact between the CPU conduit 213 and the CPU 203 is the key to cool the CPU. The plane ship of the CPU 203 generally makes the realization of thermal contact easy.

In one embodiment of this disclosure, stacked DRAM as the 3D-stacked memory package 205 is used for the server 220. Therefore, the 3D-stacked memory package 205 has a plane for obtaining effective thermal contact between the cooling liquid 238 and the 3D-stacked memory package 205.

Generally, power chip 207 is attached to a large radiator for dissipating heat into air. In one embodiment of this invention, power conduit 217 will attached to the power chip 217 for effective heat dissipation.

Sometimes, a server includes the storage 209. In one embodiment, the storage 209 is a solid-state storage. In another embodiment, the storage 209 is a hard disk drive. In any case, storage conduit 219 will provide effective heat dissipation.

In one embodiment, heat-generating components are modules, but there are some passive components which release small amount of heat. For cooling this heat, a cooling conduit may be thermally contacted with the motherboard or interposer to dissipate it.

Figure 3:
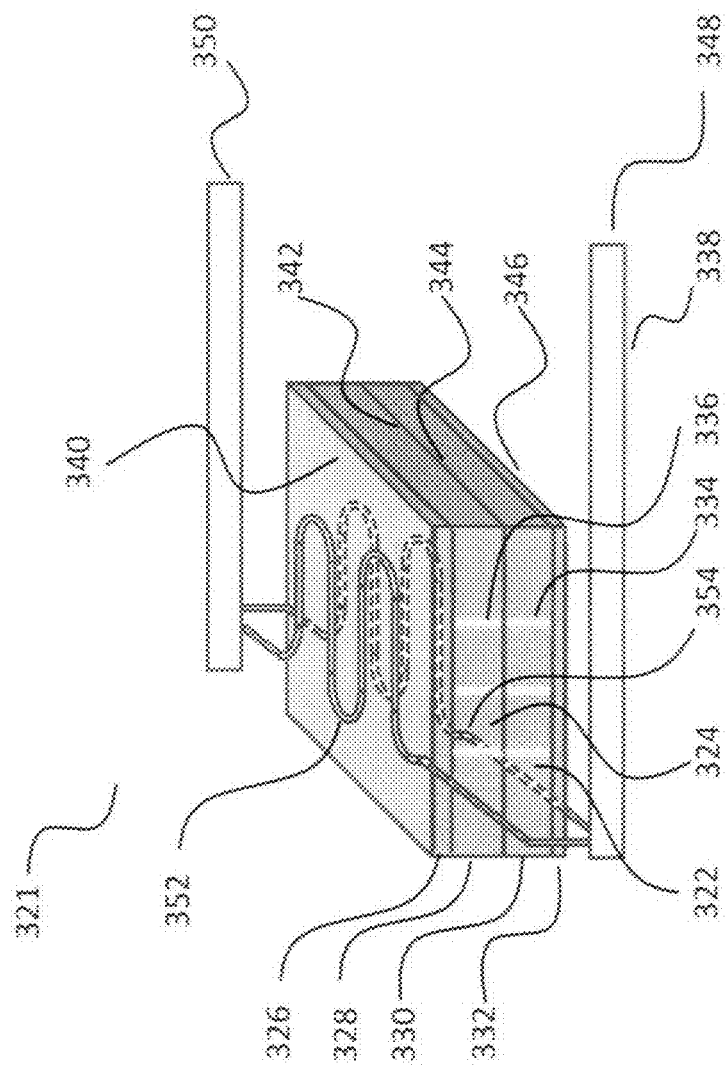
FIG. 3 depicts a schematic view of a 3D package which stacked RISC-CPU and multiple DRAM chips in accordance with one embodiment of the present invention.

FIG. 3 schematically illustrates an enlarged view of a stacked 3D IC 321 of the server 120 disposed in the server rack 114 of FIG. 1. The 3D IC 321 includes a RISC CPU 322, a 3D-staced memory 324, a CPU liquid conduit 354 configured to flow a cooling liquid 338 thermally contacting with the RISC CPU 322, a memory liquid conduit 352 configured to flow the cooling liquid 338 thermally contacting the 3D-staced memory 324.

The RISC CPU 322 has a front side 346, a back side 344, a device layer 332, a silicon layer 330, and a plural of TSV 334. Electricity is mostly consumed at the device layer 332, so that this layer becomes the main heat-generating component. In one embodiment, the cooling liquid 338 flows in the CPU liquid conduit 354 for carrying out heat from the RISC CPU 322.

In one embodiment, the 3D-staced memory 324 has a memory front side 340, a memory back side 342, a memory device layer 326, a memory silicon layer 328, and a plural of memory TSV 336. The memory back side 342 is bonded with the CPU back side 344 for mechanical and electric interconnection between the RISC CPU 322 and the 3D-staced memory 324.

The cross-sectional areas of liquid conduits impact cooling effectiveness. In one embodiment, the cross-sectional areas of the supply conduit 348 and the return conduit 350 are significantly larger than those of the MPU liquid conduit 354 and the memory liquid conduit 352.

The cooling liquid 338 is circulated in a closed loop shown in FIG. 1. Liquid conduits shown in FIG. 3 are part of the total closed loop. In order to have effective heat exchanges between heat-generating components and the cooling liquid 338, moderate flow rate in liquid conduits of heat-generating components should be kept. Generally, the turbulent flow in CPU liquid conduit 354 and the memory liquid conduit 352 should be maintained. The pump 156 shown in FIG. 1 drives the flow rate and the valve 154 controls the flow rate to ensure the effectiveness of heat dissipation.

Heat dissipation makes temperature in the return conduit 350 higher than that in the supply conduit 348. The higher temperature difference between these two conduits means more energy carried out at a same flow rate. However, low temperature difference should be kept in order to have a more uniform temperature on the heat-generating components. The non-uniformity of temperature may introduce extra stress, resulting in reliability issues. Typical temperature difference between the supply conduit 348 and return conduit 350 is about 20° C.

CPUs consume most power in a computer system. Effective contact between the CPU liquid conduit 354 and the CPU 322 is the key to cool the CPU. The plane ship of the CPU 322 generally makes the realization of thermal contact easy. In one embodiment of this invention, stacked DRAM as the 3D-staced memory 324 is used for the stacked 3D IC 321. Therefore, the 3D-staced memory 324 has a plane for obtaining effective thermal contact with the cooling liquid 338.

In one embodiment, heat-generating components are modules, but there are some passive components which release small amount of heat. For dissipating this heat, a cooling conduit may be thermally contacted with the motherboard or interposer to dissipate heat.

While the foregoing is directed to embodiments of the present invention, other and further embodiments of the invention may be devised without departing from the basic scope thereof, and the scope thereof is determined by the claims that follow.

What is claimed is:

1. A computer system, comprising
   a. One or a plural of central processing units designed by using reduced instruction set computing strategy or by using power architecture;
   b. One or a plural of dynamic random access memory packages manufactured by using three dimensional through-silicon via stacking processes;
   c. A liquid cooling system configured to thermally contact a cooling liquid with heat-generating components in said computer system;
   d. A closed conduit for flowing said cooling liquid including component conduits dissipating heat from said heat-generating components to said cooling liquid, a first pump driving said cooling liquid circulation in said closed conduit, a first exchanging conduit of a heat exchanger for dissipating heat; a supply conduit flowing said cooling liquid from a first end of said first exchanging conduit into said component conduits; a return conduit flowing said cooling liquid from said component conduits to a second end of said first conduit of said heat exchanger;
   e. A water tower configured to have an elevated water level higher than elevation of a large water body; wherein a second pump is configured to pump said cooling water from said large water body into said water tower; a drain outlet is configured at a lower elevation than said elevated water level to flow said cooling water out of said water tower; a cooling conduit configured to connect said drain outlet to a first end of said second conduit of said heat exchanger to flow said cooling water from said water tower into said heat exchanger; a back conduit configured to connect a second end of said second conduit of said heat exchanger to said large water body to flow said cooling water from said heat exchanger to said large water body.

2. The computer system of claim 1, wherein said heat exchanger further includes a second exchanger conduit wherein a cooling water flows in said second exchanger conduit; heat is dissipated from said cooling liquid in said first exchanger conduit to said cooling water in said second exchanger conduit.

3. The computer system of claim 2, wherein said large water body is a river, or a reservoir, or lake, or an ocean.

4. The computer system of claim 1, wherein said cooling liquid is deionized water, or refrigerant, or oil, or ionic liquid.

5. The computer system of claim 1, wherein said central processing unit is stacked with said dynamic random access memory package by using three-dimensional through-silicon via process.

6. The computer system of claim 1, wherein said first pump is an electromagnetic pump.

7. The computer system of claim 1, wherein said heat-generating components are said central processing unit, or said dynamic random access memory packages.

8. A computer system, comprising
  a. One or a plural of central processing units designed by using reduced instruction set computing strategy or by using power architecture;
  b. One or a plural of three-dimensional integrated circuit packages stacked by using through-silicon via processes, consisting of said central processing units and one or a plural of dynamic random access memory chips;
  c. A liquid cooling system configured to thermally contact a cooling liquid with heat-generating components in said computer system;
  d. A closed conduit for flowing said cooling liquid including component conduits dissipating heat from said heat-generating components to said cooling liquid, a first pump driving said cooling liquid circulation in said closed conduit, a first exchanging conduit of a heat exchanger for dissipating heat; a supply conduit flowing said cooling liquid from a first end of said first exchanging conduit into said component conduits; a return conduit flowing said cooling liquid from said component conduits to a second end of said first conduit of said heat exchanger;
  e. A water tower configured to have an elevated water level higher than elevation of a large water body; wherein a second pump is configured to pump said cooling water from said large water body into said water tower; a drain outlet is configured at a lower elevation than said elevated water level to flow said cooling water out of said water tower; a cooling conduit configured to connect said drain outlet to a first end of said second conduit of said heat exchanger to flow said cooling water from said water tower into said heat exchanger; a back conduit configured to connect a second end of said second conduit of said heat exchanger to said large water body to flow said cooling water from said heat exchanger to said large water body.

9. The computer system of claim 8, wherein said heat exchanger further includes a second exchanger conduit wherein a cooling water flows in said second exchanger conduit; heat is dissipated from said cooling liquid in said first exchanger conduit to said cooling water in said second exchanger conduit.

10. The computer system of claim 9, wherein said large water body is a river, or a reservoir, or lake, or an ocean.

11. The computer system of claim 8, wherein said cooling liquid is deionized water, or refrigerant, or oil, or ionic liquid.

12. The computer system of claim 8, wherein said central processing unit is stacked with said dynamic random access memory package by using three-dimensional through-silicon via process.

13. The computer system of claim 8, wherein said first pump is an electromagnetic pump.

14. The computer system of claim 8, wherein said heat-generating components are said central processing unit, or said dynamic random access memory packages.

* * * * *